United States Patent
Hung et al.

(10) Patent No.: US 9,556,015 B1
(45) Date of Patent: Jan. 31, 2017

(54) SUBSTRATE STRUCTURE, SEMICONDUCTOR STRUCTURE AND METHOD FOR FABRICATING THE SAME

(71) Applicant: TAIWAN SEMICONDUCTOR MANUFACTURING CO., LTD., Hsinchu (TW)

(72) Inventors: Tsai-Hao Hung, Hsinchu (TW); Shih-Chi Kuo, Taoyuan (TW); Tsung-Hsien Lee, Tainan (TW); Tao-Cheng Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/925,867

(22) Filed: Oct. 28, 2015

(51) Int. Cl.
*H01L 21/00* (2006.01)
*B81B 1/00* (2006.01)
*B81C 1/00* (2006.01)

(52) U.S. Cl.
CPC ........... *B81B 1/004* (2013.01); *B81C 1/00087* (2013.01); *B81B 2203/0127* (2013.01); *B81B 2203/0163* (2013.01); *B81B 2203/0315* (2013.01); *B81B 2203/04* (2013.01); *B81C 2201/0104* (2013.01); *B81C 2201/0108* (2013.01); *B81C 2201/0132* (2013.01); *B81C 2203/0118* (2013.01)

(58) Field of Classification Search
CPC ...................................................... B81B 1/004
See application file for complete search history.

(56) References Cited

U.S. PATENT DOCUMENTS

| | | | |
|---|---|---|---|
| 2004/0106294 A1* | 6/2004 | Lee | B81C 1/00269 438/691 |
| 2005/0241135 A1* | 11/2005 | Heschel | B81B 1/004 29/592 |
| 2010/0176469 A1* | 7/2010 | Schmollngruber | B81B 7/0006 257/419 |
| 2012/0193785 A1* | 8/2012 | Lin | H01L 21/76229 257/737 |
| 2015/0056407 A1* | 2/2015 | Astier | G01N 27/4145 428/137 |
| 2015/0232323 A1* | 8/2015 | Haberer | B81C 1/00103 257/618 |
| 2016/0045935 A1* | 2/2016 | Yoon | B06B 1/0292 310/309 |
| 2016/0240568 A1* | 8/2016 | Hung | H01L 27/1463 |

* cited by examiner

*Primary Examiner* — Alexander Ghyka
(74) *Attorney, Agent, or Firm* — Maschoff Brennan

(57) ABSTRACT

The present disclosure provides a substrate structure for a micro electro mechanical system (MEMS) device. The substrate structure includes a cap and a micro electro mechanical system (MEMS) substrate. The cap has a cavity, and the MEMS substrate is disposed on the cap. The MEMS substrate has a plurality of through holes exposing the cavity, and an aspect ratio of the through hole is greater than 30.

20 Claims, 11 Drawing Sheets

SUBSTRATE STRUCTURE, SEMICONDUCTOR STRUCTURE AND METHOD FOR FABRICATING THE SAME

BACKGROUND

Manufacturing of an integrated circuit (IC) has been largely driven by the need to increase the density of the integrated circuit formed in a semiconductor device. This is typically accomplished by implementing more aggressive design rules to allow larger density of IC device to be formed. Nonetheless, the increased density of the IC devices, such as transistors, has also increased the complexity of processing semiconductor devices with the decreased feature sizes.

Micro electro mechanical system (MEMS) is a technology generally referred to as miniaturized mechanical and electro-mechanical elements (i.e., devices and structures) that are made using the techniques of micro-fabrication. MEMS structures are recently developed in the field of integrated circuit technology in which MEMS devices are formed on a substrate to feature mechanical and electrical features. The MEMS devices include such as sensors, valves, gears, actuators, mirrors, heaters, printer nozzles and so on. Generally, a MEMS structure includes a substrate structure with MEMS devices and a cap structure, and the MEMS devices are positioned therebetween. In the manufacturing process of MEMS structure, further improvements are constantly necessary to satisfy the performance requirement in the scaling down process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
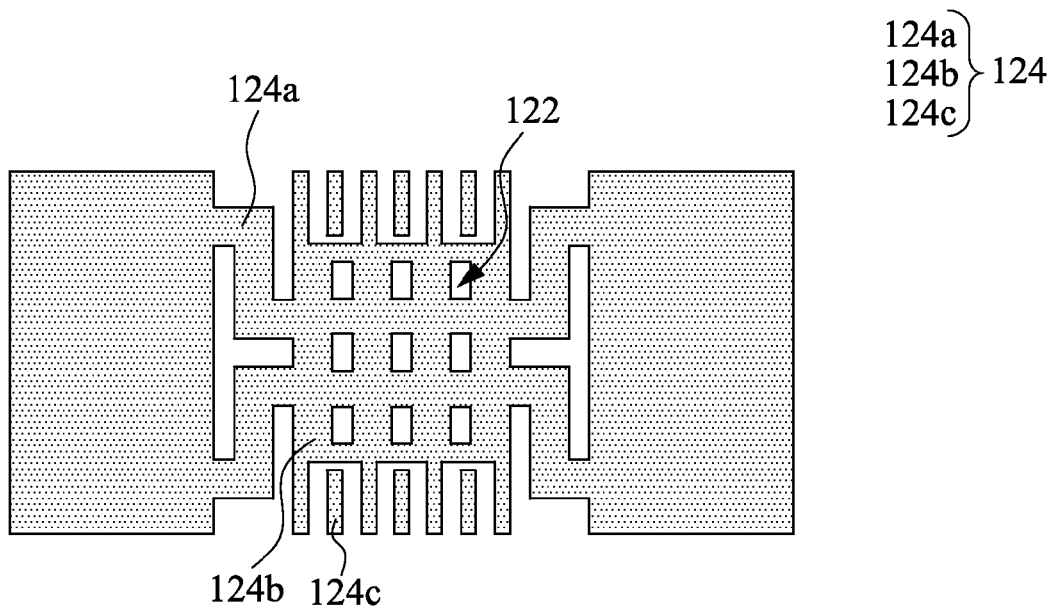
FIG. 1A is a schematic top view of a MEMS substrate in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, a wafer is polished to a desired thickness, and through holes are formed in the wafer to define different micro electro mechanical system (MEMS) structures, such as a spring and a proof mass. Since the sizes of the MEMS structures are decreased along with the decreased feature sizes of the semiconductor devices, thickness of the MEMS structures have to be increased to satisfy the requirement of the MEMS structures, such as the mass of the proof mass and the strength of the spring. However, the thickness of the MEMS structure is limited by process capability. Specifically, an aspect ratio of the through hole formed by the present technique is limited to a value less than 30, and therefore the through hole is unable to penetrate the wafer having larger thickness and define the MEMS structures.

In order to solve the above-mentioned problems, the present disclosure provides a substrate structure for a MEMS device, a semiconductor structure and a method for fabricating the same. The substrate structure and the semiconductor structure include a through hole, and an aspect ratio of the through hole is greater than 30 to satisfy the requirement of the semiconductor structure in the next generation.

FIG. 1A is a schematic top view of a MEMS substrate 120 in accordance with some embodiments. As shown in FIG. 1A, the MEMS substrate 120 includes a plurality through holes 122 to define different MEMS structures 124. Specifically, the MEMS structures 124 in FIG. 1A are a spring 124a, a proof mass 124b and a capacitor plate 124c, but not limited thereto. The spring 124a support the proof mass 124b and allow the proof mass 124b to move in different directions (for example, +x, −x, +y, −y, +z or −z directions). In addition, the mass 124b and capacitor plate 124c are both conductive, and hence form capacitors.

In some embodiment, the MEMS substrate 120 is an accelerometer. If MEMS substrate 120 does not sense acceleration, the proof mass 124b is located at a balance point. When MEMS substrate 120 senses acceleration in one of the directions, the proof mass 124b moves to the direction opposite to the acceleration direction. Therefore, the capacitance between proof mass 124b and the capacitor plate 124c is changed accordingly. By measuring the change of the capacitance, the acceleration rate and the acceleration direction is calculated.

In various embodiments, the MEMS structure 124 is any suitable structure. Examples of the MEMS structure 124 may further include but not limited to an actuator, a sensor, a valve, a gear, a gyroscope, a lever, and a hinge. Common application of the MEMS structure 124 further includes pressure sensors, gyroscopes, compasses, microphone, oscillators, actuators, mirrors, heaters, and printer nozzles.

Figure 1B:
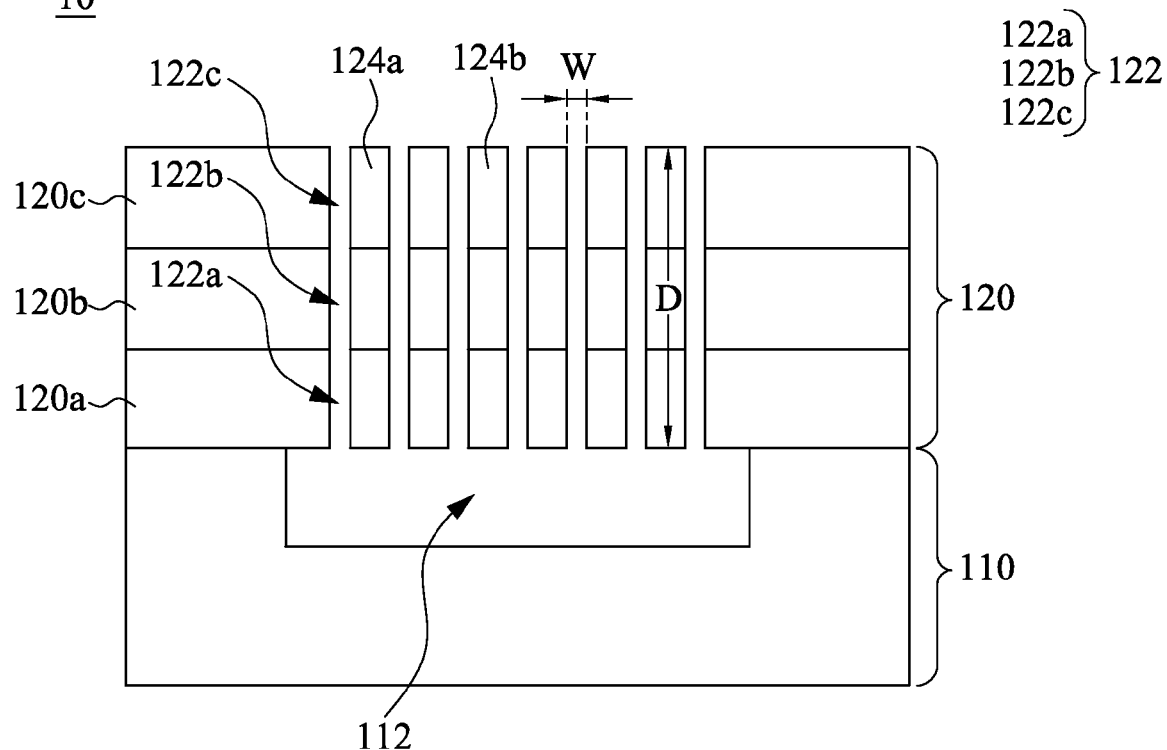
FIG. 1B is a schematic cross-sectional view of a substrate structure for a MEMS device in accordance with some embodiments.

FIG. 1B is a schematic cross-sectional view of a substrate structure 10 for a MEMS device in accordance with some embodiments. The substrate structure 10 includes a cap 110 and the MEMS substrate 120. The cap 110 includes a cavity 112, and the MEMS substrate 120 is disposed on the cap 110. The cavity 112 is exposed by the through hole 122 of the MEMS substrate 120, and an aspect ratio of the through hole 122 is greater than 30. The aspect ratio of the through hole 122 is a ratio of a depth D of the through hole 122 to a width W of the through hole 122. In some embodiments, the width W of the through hole 122 is in a range from about 1 um to about 2 um. In some embodiment, the depth D of the through hole 122 is in a range from about 60 um to about 90 um. In some embodiments, the substrate structure 10 further includes a etch stop layer disposed between the cap 110 and the MEMS substrate 120. Explained in a different way, the etch stop layer is on a surface of the cap 110 facing toward the MEMS substrate 120.

In various embodiments, the aspect ratio of the through hole 122 is 35, 40, 45, 50, 55, 60, 65, 70, 75, 75, 80, 85, 90, but not limited thereto.

In some embodiments, the cap 110 and the MEMS substrate 120 are bulk silicon substrates. In various embodiments, the cap 110 and the MEMS substrate 120 include an elementary semiconductor including silicon or germanium in crystal, polycrystalline, and/or an amorphous structure. In various embodiments, the cap 110 and the MEMS substrate 120 include a compound semiconductor including silicon carbide, gallium arsenic, gallium phosphide, indium phosphide, indium arsenide, and/or indium antimonide. In various embodiments, the cap 110 and the MEMS substrate 120 include an alloy semiconductor including SiGe, GaAsP, AlInAs, AlGaAs, GaInAs, GaInP, and/or GaInAsP; any other suitable material; and/or combinations thereof.

In some embodiments, the cap 110 and the MEMS substrate 120 are blanket wafers free from active components (such as, P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and high frequency transistors) therein.

As shown in FIG. 1B, each of the through hole 122 is composed by a first sub-through hole 122a, a second sub-through hole 122b and a third sub-through hole 122b. Specifically, the MEMS substrate 120 is formed by at least two substrates. The MEMS substrate 120 illustrated in FIG. 1B includes a first substrate 120a, a second substrate 120b and a third substrate 120c, but not limited thereto. The first substrate 120a cover the cavity 112 of the cap 110, and a plurality of the first sub-through holes 122a are through the first substrate 120a to expose the cavity 112. The second substrate 120b is disposed on the first substrate 120a, and a plurality of the second sub-through holes 122b are through the second substrate 120b. Each of the second sub-through holes 122b is substantially aligned with one of the first sub-through holes 122a. The third substrate 120c is disposed on the second substrate 120b, and a plurality of the third sub-through holes 122c are through the third substrate 120c. Each of the third sub-through holes 122c is substantially aligned with one of the second sub-through holes 122b. The term "substantially aligned" refers to align with some acceptable deviation and does not require exact alignment. Therefore, the first sub-through hole 122a, the second sub-through hole 122b and the third sub-through hole 122c jointly form the through hole 122, and the aspect ratio of the through hole 122 is greater than 30 since the first sub-through hole 122a, the second sub-through hole 122b and the third sub-through hole 122c all have an aspect ratio of about 30. Although the MEMS substrate 120 illustrated in FIG. 1B is composed by three substrates, the amount of the substrate is not limited thereto.

Figure 1C:
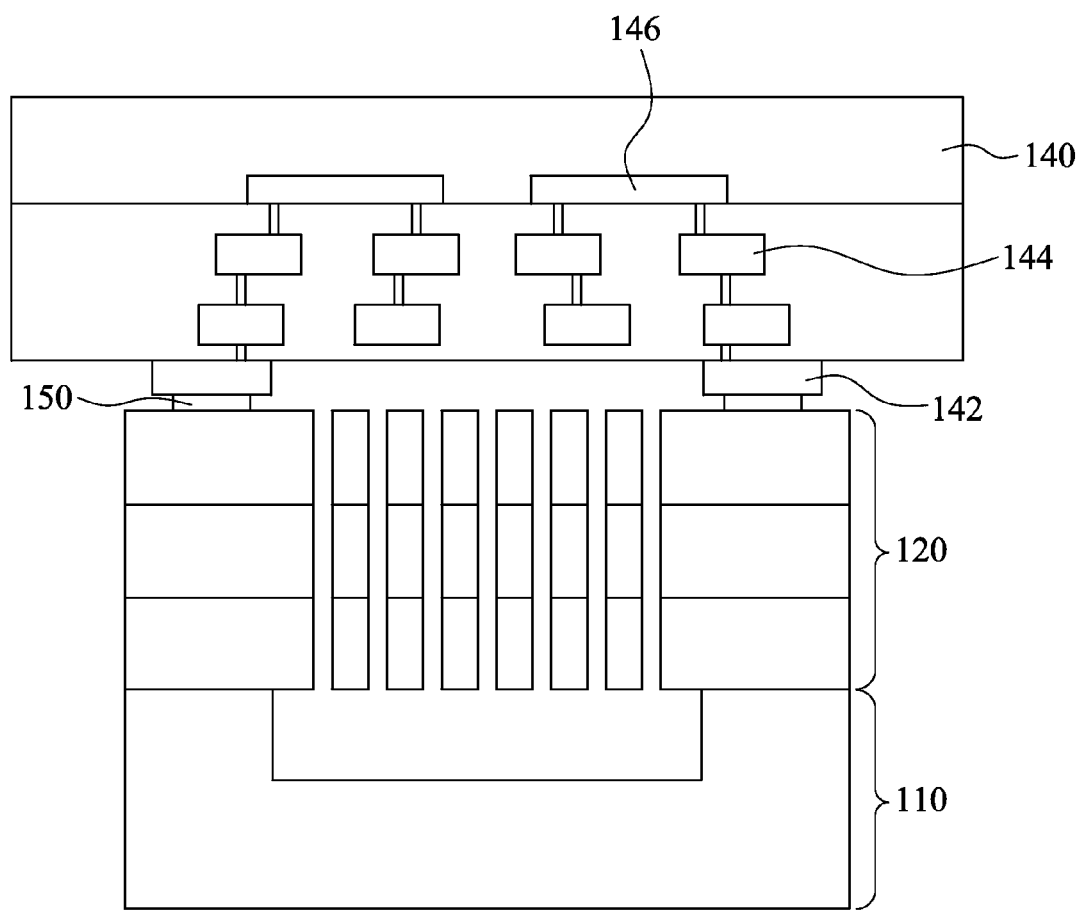
FIG. 1C is a schematic cross-sectional view of a semiconductor structure in accordance with some embodiments.

Referring now to FIG. 1C, FIG. 1C is a schematic cross-sectional view of a semiconductor structure in accordance with some embodiments. In FIG. 1C, a semiconductor structure 100 includes a device substrate 140 disposed on the substrate structure 10, and the device substrate 140 is bonded with the substrate structure 10. Specifically, the substrate structure 10 further includes a first bonding pad 150 on the MEMS substrate 120, and the device substrate 140 further includes a second bonding pad 142 disposed below the device substrate 140, which the second bonding pad 142 is bonded with the first bonding pad 150. In some embodiments, the first bonding pad 150 and the second bonding pad 142 are made of a material selected from the group consisting of aluminum (Al), gold (Au), titanium (Ti), tantalum (Ta), nickel (Ni) and tin (Sn). In some embodiments, a eutectic bonding such as Ge/Al, Ge/Au or Si/Au is formed between the first bonding pad 150 and the second bonding pad 142. In some embodiments, a diffusion bonding such as Si/Al or Si/Ti is formed between the first bonding pad 150 and the second bonding pad 142.

The device substrate 140 further includes one or more integrated circuits 146, and interconnect layers 144 (e.g., metal lines and vias), and the second bonding pad 142 is electrically connected to the integrated circuits 146 by the interconnect layers 144. In some embodiments, the integrated circuits 146 are CMOS devices, such as transistors (e.g., NMOS and PMOS transistors). In some embodiments, the device substrate 140 also includes isolation structures and/or any other elements associated with integrated circuits 146.

Figure 2:
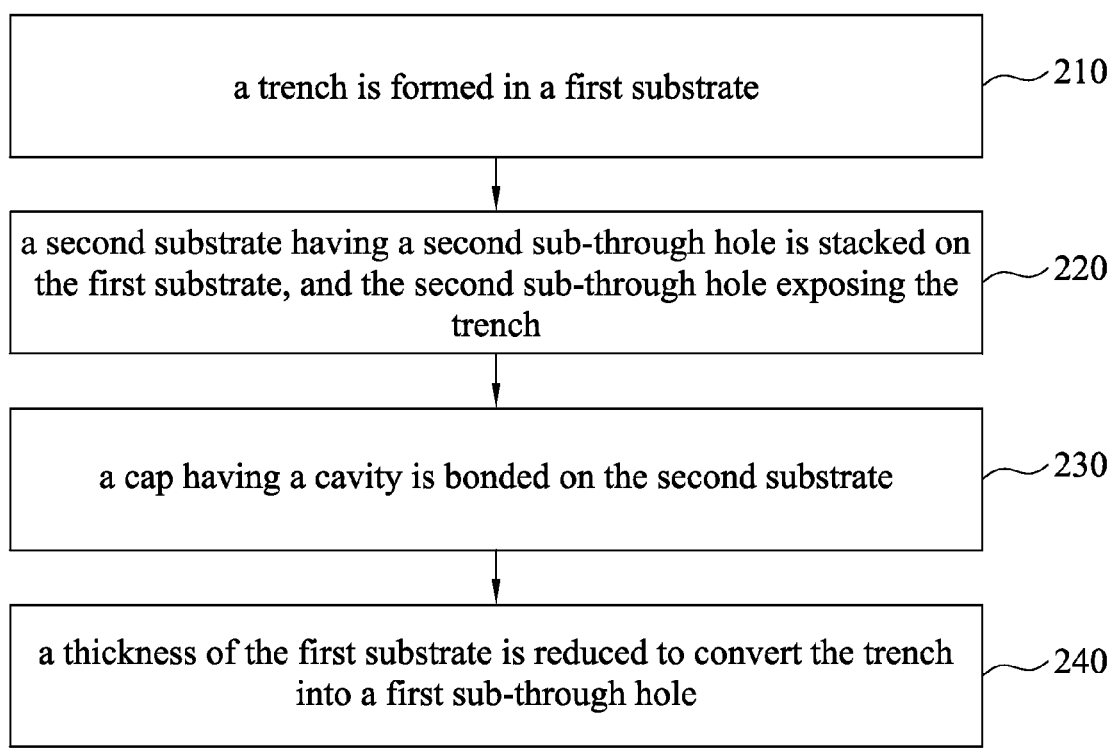
FIG. 2 illustrates a flow chart of a method of fabricating a semiconductor structure, in accordance with various embodiments.

Another aspect of the present disclosure provides a method of fabricating a semiconductor structure. Referring to FIG. 2, FIG. 2 illustrates a flow chart of a method of fabricating a semiconductor structure, in accordance with various embodiments. The flow chart includes following steps. In operation 210, a trench is formed in a first substrate. In operation 220, a second substrate having a second sub-through hole is stacked on the first substrate, and the second sub-through hole exposes the trench. In operation 230, a cap having a cavity is bonded on the second substrate. In operation 240, a thickness of the first substrate is reduced to convert the trench into a first sub-through hole.

Figure 3A:
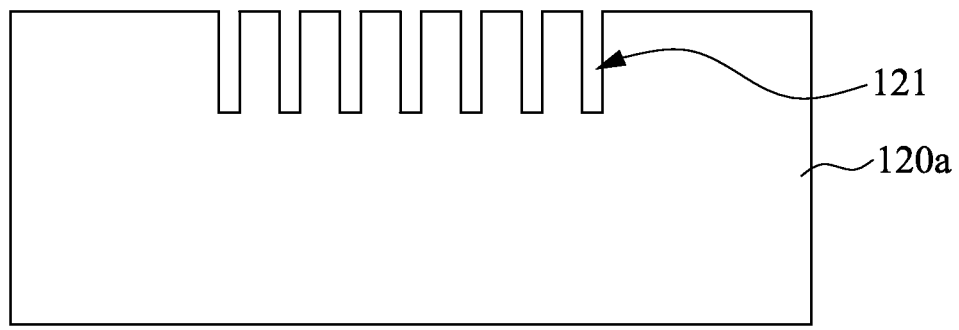
FIGS. 3A to 3E are cross-sectional views of the semiconductor structure in FIG. 1C at an intermediate stage of fabrication, in accordance with various embodiments.

Referring to FIGS. 3A to 3E at the same time. FIGS. 3A to 3E are cross-sectional views of the semiconductor structure in FIG. 1C at an intermediate stage of fabrication, in accordance with various embodiments. In FIG. 3A and operation 210, a trench 121 is formed in a first substrate 120a. The trench 121 may be fabricated using suitable processes including photolithography and etch processes. The photolithography process may include forming a photoresist layer (not shown) overlying the first substrate 120a, exposing the photoresist layer to form a pattern, performing post-exposure bake processes, and developing the pattern to form a masking element. The masking element mentioned above is used to protect portions of the first substrate 120a while forming trenches 121 in the first substrate 120a by the etching process. In some embodiments, the etching process is a deep reactive-ion etching (DRIE) process, so as to ensures the trench 121 having highly vertical sidewalls. In various embodiments, the trench 121 has a depth less than 30 um, and a width of the trench 121 is in a range from about 1 um to about 2 um.

Figure 3B:
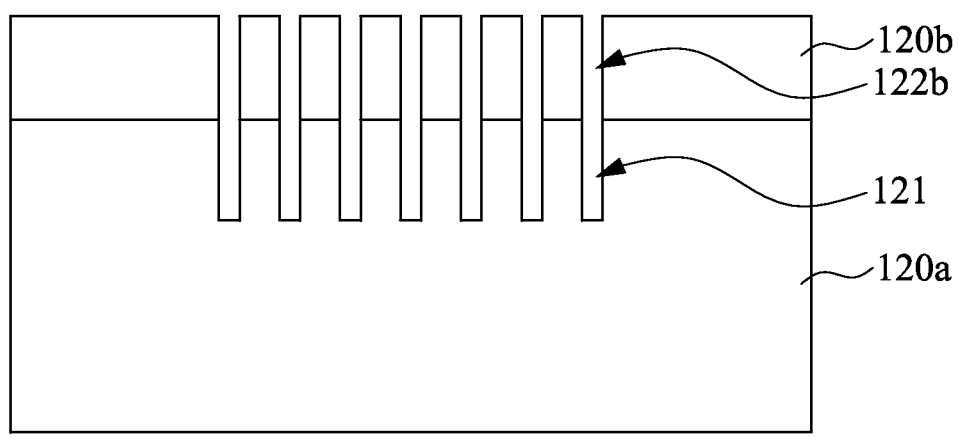

Continuing in FIG. 3B and operation 220, a second substrate 120b having a second sub-through hole 122b is stacked on the first substrate 120a, and the second sub-through hole 122b exposes the trench 121. The second substrate 120b is bonded on the first substrate 120a, and the photolithography and etch processes (such as the DRIE process) mentioned in FIG. 3A is performed to form the second sub-through hole 122b, which is substantially aligned with the trench 121 to expose the trench 121. In some embodiments, a thickness of the second substrate 120b is reduced before forming the second sub-through hole 122b. In various embodiments, the first substrate 120a and the second substrate 120b are bonded by using suitable processes, such as eutectic bonding, thermal compression bonding and adhesive bonding. In various embodiments, the second sub-through hole 122b has a depth less than 30 um, and a width of the second sub-through hole 122b is in a range from about 1 um to about 2 um.

In some other embodiments, the second sub-through hole 122b is formed in the second substrate 120b before bonding the first substrate 120a and the second substrate 120b. Specifically, the thickness of the second substrate 120b is reduced, and the photolithography and etch processes (such as the DRIE process) mentioned in FIG. 4A is performed to form the second sub-through hole 122b. Then, the second substrate 120b having a plurality of the second sub-through holes 122b is bonded with the first substrate, and each of the second sub-through holes 122b is substantially aligned with one trench 121.

Figure 3C:
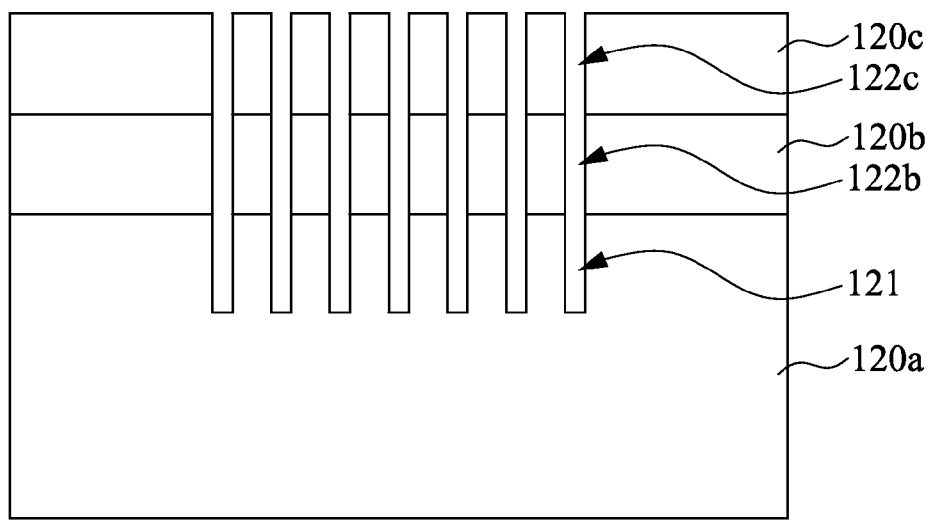

Continuing in FIG. 3C, FIG. 3C illustrates an optional operation in accordance with various embodiments. In FIG. 3C, a third substrate 120c having a third sub-through hole 122c is stacked on the second substrate 120b, and the third sub-through hole 122c exposes the second sub-through holes 122b. The third substrate 120c is bonded on the second substrate 120b, and the photolithography and etch processes (such as the DRIE process) mentioned in FIG. 3A is performed to form the third sub-through hole 122c, which is substantially aligned with the second sub-through holes 122b to expose the second sub-through holes 122b. In some embodiments, a thickness of the third substrate 120c is reduced before forming the third sub-through hole 122c. In some embodiments, the second substrate 120b and the third substrate 120c are bonded by using suitable processes, such as eutectic bonding, thermal compression bonding and adhesive bonding. In various embodiments, the third sub-through hole 122c has a depth less than 30 um, and a width of the third sub-through hole 122c is in a range from about 1 um to about 2 um. In various embodiments, the operation in FIG. 3C is omitted without departing from the scope and the spirit of the present disclosure.

In some other embodiments, the third sub-through hole 122c is formed in the third substrate 120c before bonding the second substrate 120b and the third substrate 120c. Specifically, the thickness of the third substrate 120c is reduced, and the photolithography and etch processes (such as the DRIE process) mentioned in FIG. 4A is performed to form the third sub-through hole 122c. Then, the third substrate 120c having a plurality of the third sub-through holes 122c is bonded with the second substrate 120c, and each of the third sub-through holes 122c is substantially aligned with one second sub-through holes 122b.

In some embodiments, the first substrate 120a, the second substrate 120c and the third substrate 120c are blanket wafers free from active components.

Figure 3D:
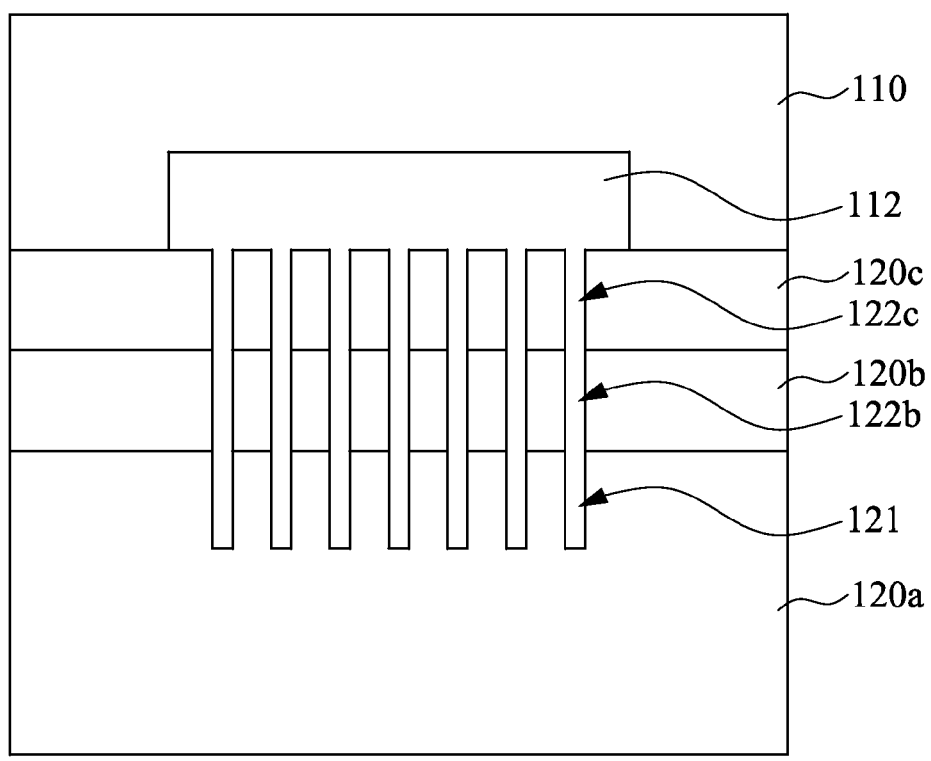

Continuing in FIG. 3D and operation 230, a cap 110 having a cavity 112 is bonded on the second substrate 120b. As shown in FIG. 3D, the cap 110 is bonded with the third substrate 120c, and the third sub-through hole 122c and the cavity 112 are connected. In some embodiments, the cap 110 is formed from the blanket wafer, and the photolithography and etch processes are performed to the blanket wafer to form the cavity 112. In various embodiments, the third substrate 120c and the cap 110 are bonded by using suitable processes, such as eutectic bonding, thermal compression bonding and adhesive bonding.

In some other embodiments, the cap 110 is bonded with the second substrate 120b while the operation mentioned in FIG. 3C is omitted, and the second sub-through hole 122b and the cavity 112 are connected.

Figure 3E:
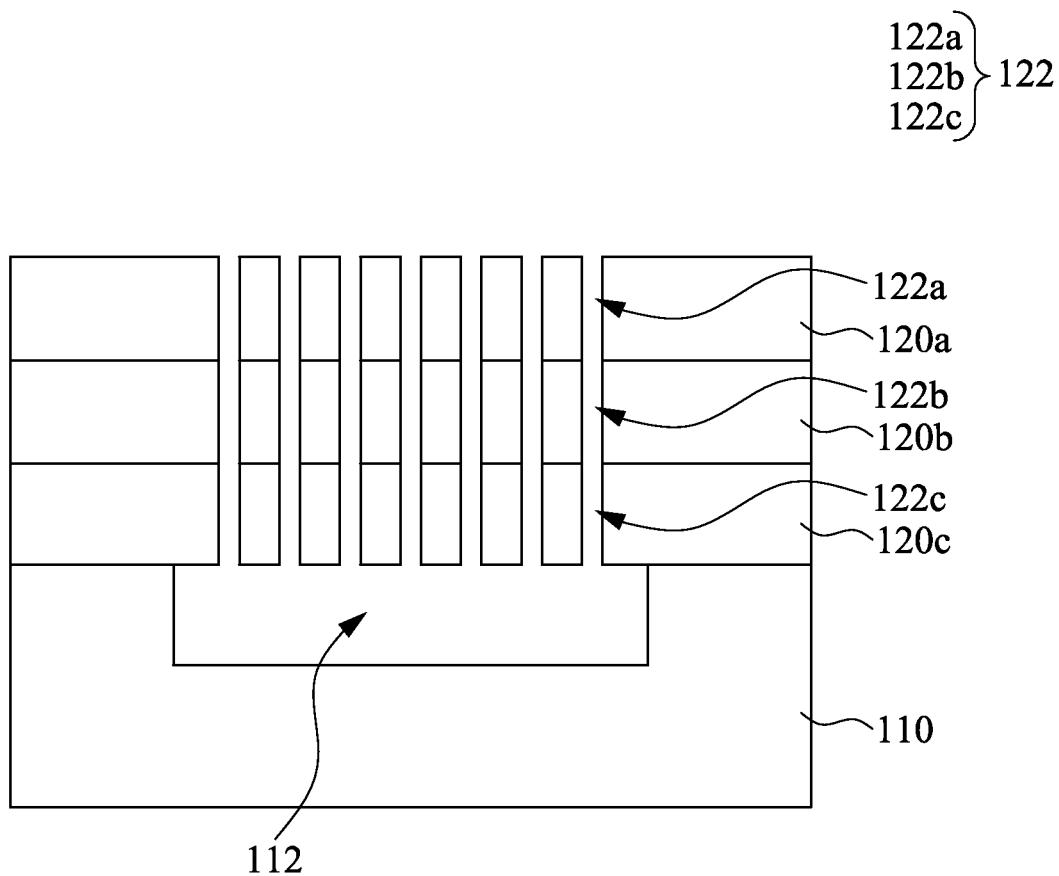

Continuing in FIG. 3E and operation 240, a thickness of the first substrate 120a is reduced to convert the trench 121 into a first sub-through hole 122a. The cap 110 provides supporting force to prevent the collapse of the first substrate 120a, the second substrate 120b and the third substrate 120c. First, the intermediate structure in FIG. 3D is flipped, and the thickness of the first substrate 120a is reduced to expose a bottom of the trench 121, so as to convert the trench 121 into the first sub-through hole 122a. In some embodiments, the thickness of the first substrate 120a is reduced by multiple steps. For example, a chemical mechanical polishing (CMP) process is performed first to reduce the thickness of the first substrate 120a, but a remaining thickness is on the trench 121 after the CMP process to prevent the slurry entering the cavity 112. Then, a dry etching process is performed to remove the remaining thickness, and thus exposes bottom of the trench 121 to convert the trench 121 into the first sub-through hole 122a. The first sub-through hole 122a, the second sub-through hole 122b and the third sub-through hole 122c jointly form the through hole 122 having aspect ratio greater than 30, and different MEMS structures 124 are separated by the through holes 122.

The method further includes an operation of bonding a device substrate 140 to the first substrate 120a to form the semiconductor structure shown in FIG. 1C. A first bonding pad 150 is formed on the first substrate 120a, and the first bonding pad 150 is bonded to a second bonding pad 142 of the device substrate 140 by using suitable processes, such as eutectic bonding, thermal compression bonding and adhesive bonding. The device substrate 140 further includes one or more integrated circuits 146, and interconnect layers 144 (e.g., metal lines and vias), and the second bonding pad 142 is electrically connected to the integrated circuits 146 by the interconnect layers 144.

Figure 4:
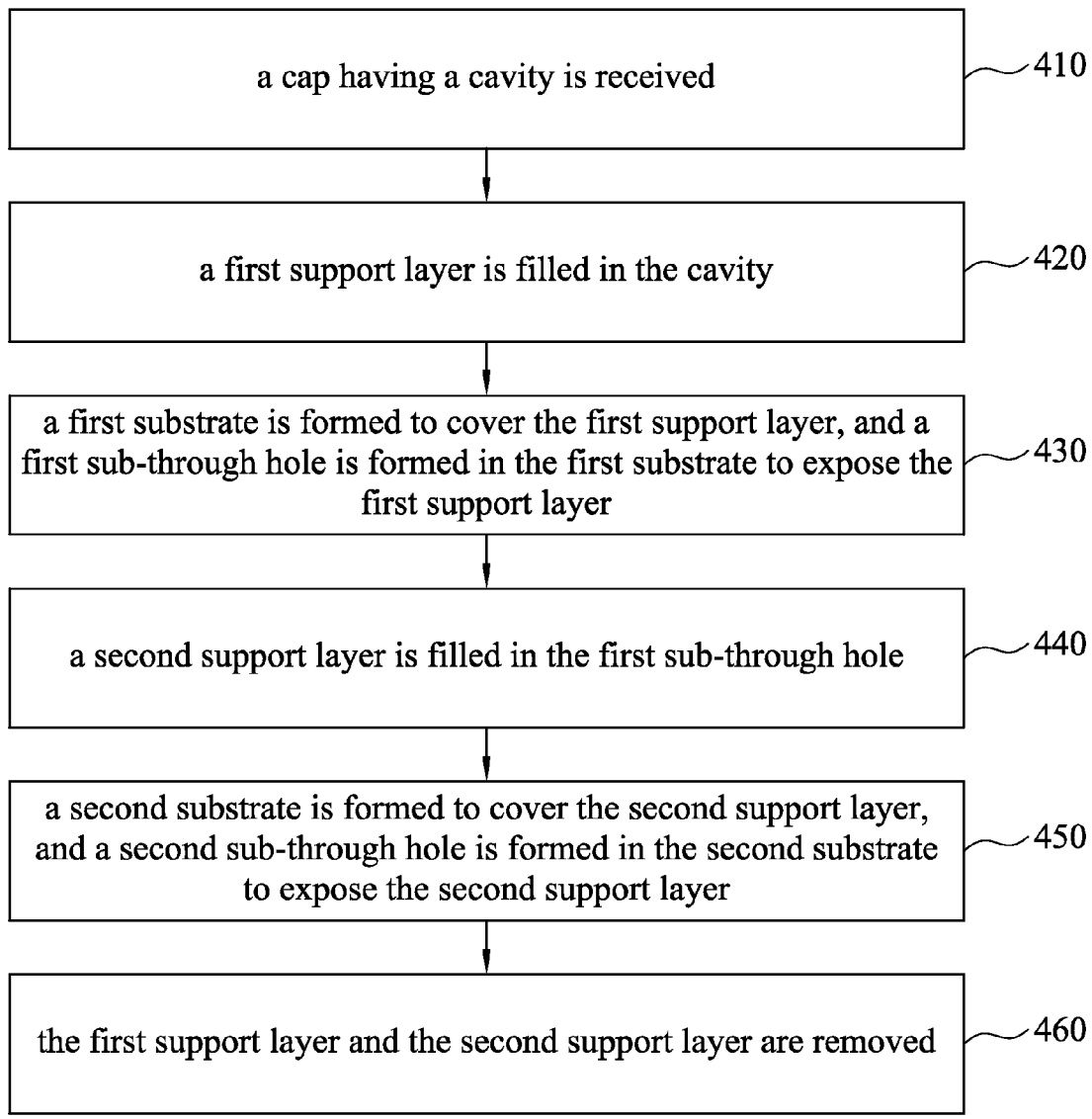
FIG. 4 illustrates a flow chart of another method of fabricating a semiconductor structure, in accordance with various embodiments.

Another aspect of the present disclosure provides another method of fabricating a semiconductor structure. Referring to FIG. 4, FIG. 4 illustrates a flow chart of a method of fabricating a semiconductor structure, in accordance with various embodiments. The flow chart includes following steps. In operation 410, a cap having a cavity is received. In operation 420, a first support layer is filled in the cavity. In operation 430, a first substrate is formed to cover the first support layer, and a first sub-through hole is formed in the first substrate to expose the first support layer. In operation 440, a second support layer is filled in the first sub-through hole. In operation 450, a second substrate is formed to cover the second support layer, and a second sub-through hole is formed in the second substrate to expose the second support layer. In operation 460, the first support layer and the second support layer are removed.

Figure 5A:
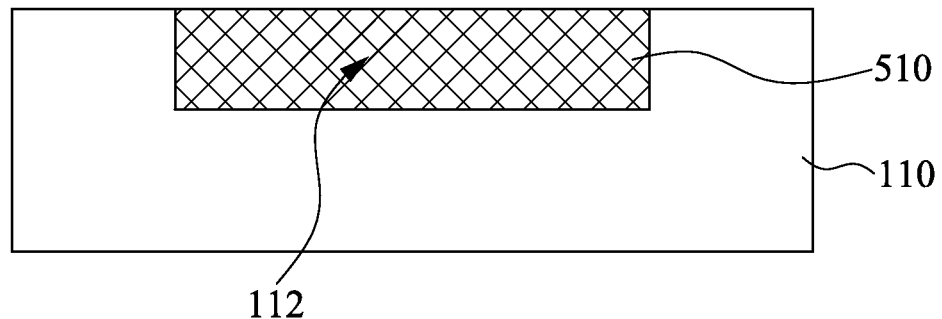
FIGS. 5A to 5G are cross-sectional views of the semiconductor structure in FIG. 1C at an intermediate stage of fabrication, in accordance with various embodiments.

Referring to FIG. 5A to 5G at the same time. FIGS. 5A to 5G are cross-sectional views of the semiconductor structure in FIG. 1C at an intermediate stage of fabrication, in accordance with various embodiments. FIG. 5A illustrates operation 410 and operation 420, which a cap 110 having a cavity 112 is received, and a first support layer 510 is filled in the cavity 112. In some embodiments, the cap 110 is formed from the blanket wafer, and the photolithography and etch processes are performed to the blanket wafer to form the cavity 112. In various embodiments, the first support layer 510 is fully filled the cavity 112 by using a deposition process, such as a CVD or a PVD process, but not limited thereto.

Figure 5B:
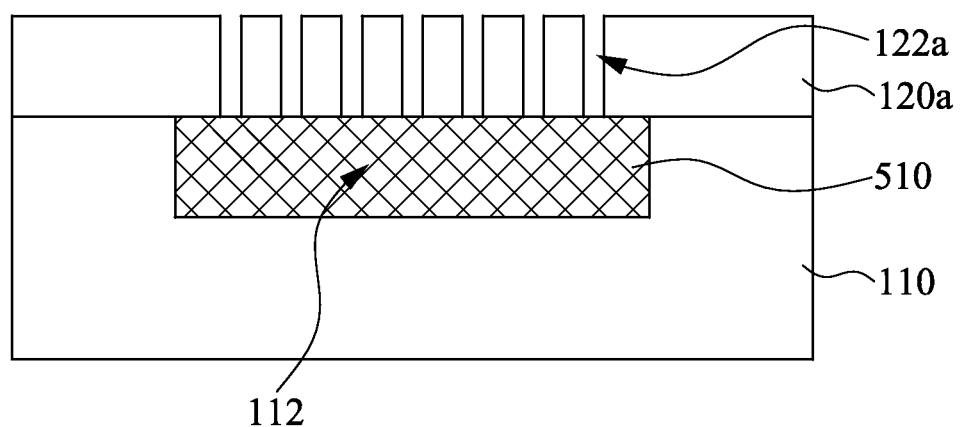

Continuing in FIG. 5B and operation 430, a first substrate 120a is formed to cover the first support layer 510, and a first sub-through hole 122a is formed in the first substrate 120a to expose the first support layer 510. The first substrate 120a is bonded to the cap 112, and the photolithography and etch processes (such as the DRIE process) process) mentioned in FIG. 3A is performed to form the first sub-through hole 122a exposing the first support layer 510. The first support layer 510 provides supporting force to prevent the collapse of the first substrate 120a during forming the first sub-through hole 122a. In some embodiments, a thickness of the first substrate 120a is reduced before forming the first sub-through hole 122a. In some embodiments, the first substrate 120a and the cap 112 are bonded by using suitable processes, such as eutectic bonding, thermal compression bonding and adhesive bonding.

Figure 5C:
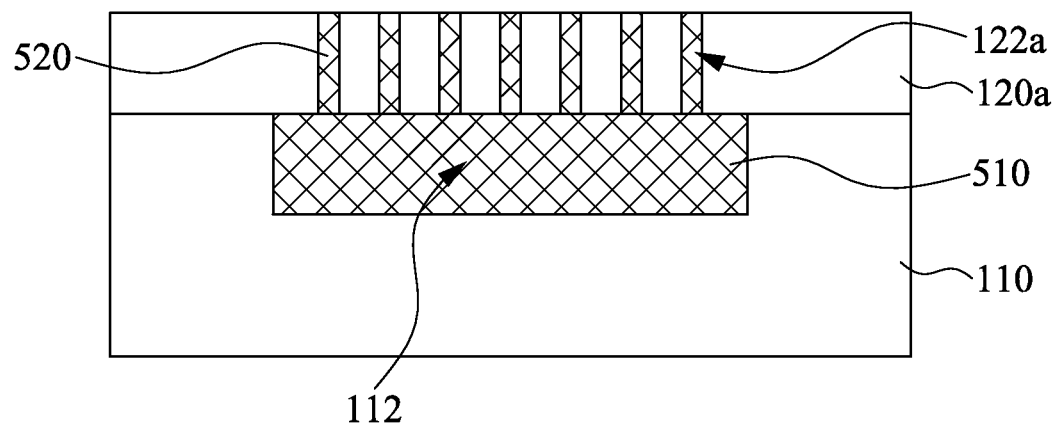

Continuing in FIG. 5C and operation 440, a second support layer 520 is filled in the first sub-through hole 122a. In various embodiments, the second support layer 520 is fully filled the first sub-through hole 122a by using a deposition process, such as a CVD or a PVD process, but not limited thereto.

Figure 5D:
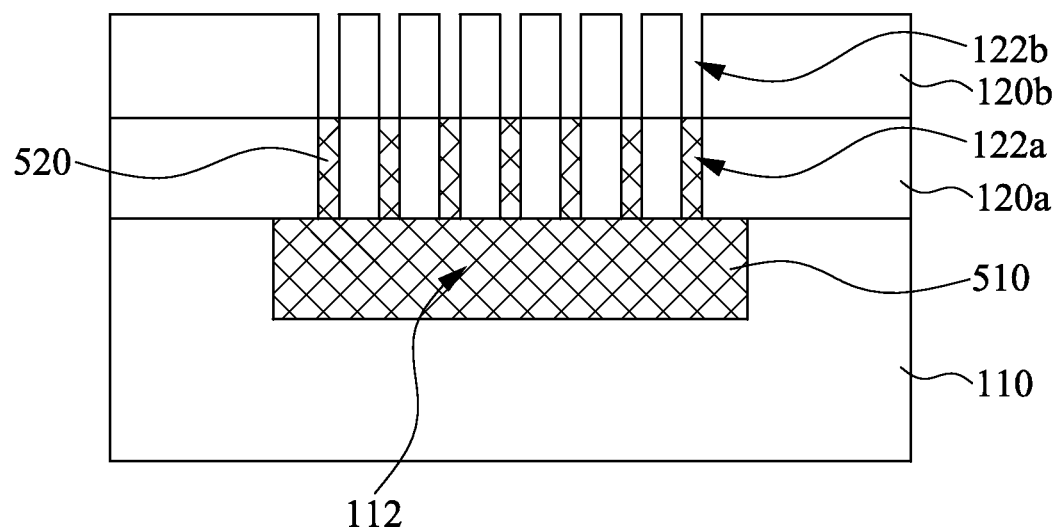

Continuing in FIG. 5D and operation 450, a second substrate 120b is formed to cover the second support layer 520, and a second sub-through hole 122b is formed in the second substrate 120b to expose the second support layer 520. The second substrate 120b is bonded to the first substrate 120a, and the photolithography and etch processes (such as the DRIE process) mentioned in FIG. 3A are performed to form the second sub-through hole 122b exposing the second support layer 520. The second support layer 520 provides supporting force to prevent the collapse of the second substrate 120b during forming the second sub-through hole 122b. In some embodiments, a thickness of the second substrate 120b is reduced before forming the second sub-through hole 122b. In some embodiments, the first substrate 120a and the second substrate 120b are bonded by using suitable processes, such as eutectic bonding, thermal compression bonding and adhesive bonding.

Figure 5E:
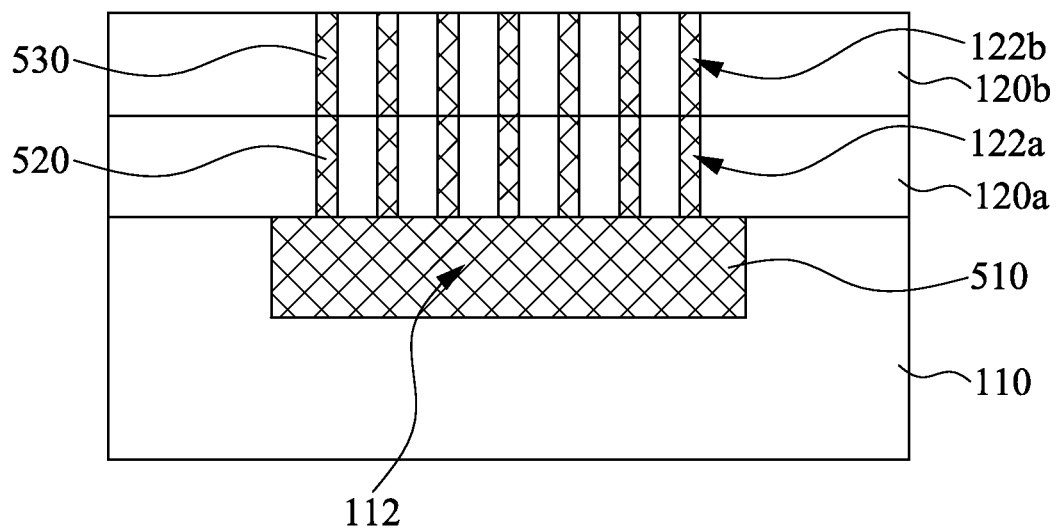
Figure 5F:
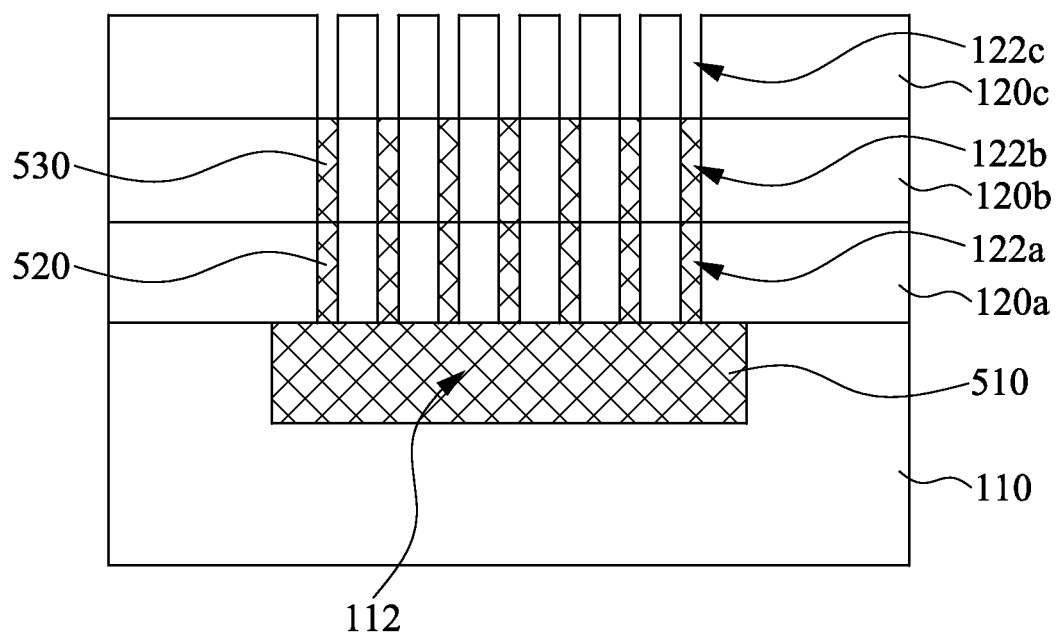

Continuing in FIGS. 5E and 5F, FIGS. 5E and 5F illustrates optional operations in accordance with various embodiments, and the operations in FIGS. 6E and 6F may be omitted without departing from the scope and the spirit of the present disclosure. In FIG. 5E, a third support layer 530 is filled in the second sub-through hole 122b. In various embodiments, the third support layer 530 is fully filled the second sub-through hole 122b by using a deposition process, such as a CVD or a PVD process, but not limited thereto.

In FIG. 5F, a third substrate 120c is formed to cover the third support layer 520, and a third sub-through hole 122c is formed in the third substrate 120c to expose the third support layer 530. The third substrate 120c is bonded to the second substrate 120b, and the photolithography and etch processes (such as the DRIE process) mentioned in FIG. 3A are performed to form the third sub-through hole 122c exposing the third support layer 530. The third support layer 530 provides supporting force to prevent the collapse of the third substrate 120c during forming the third sub-through hole 122c. In some embodiments, a thickness of the third substrate 120c is reduced before forming the third sub-through hole 122c. In some embodiments, the second substrate 120b and the third substrate 120c are bonded by using suitable processes, such as eutectic bonding, thermal compression bonding and adhesive bonding.

Figure 5G:
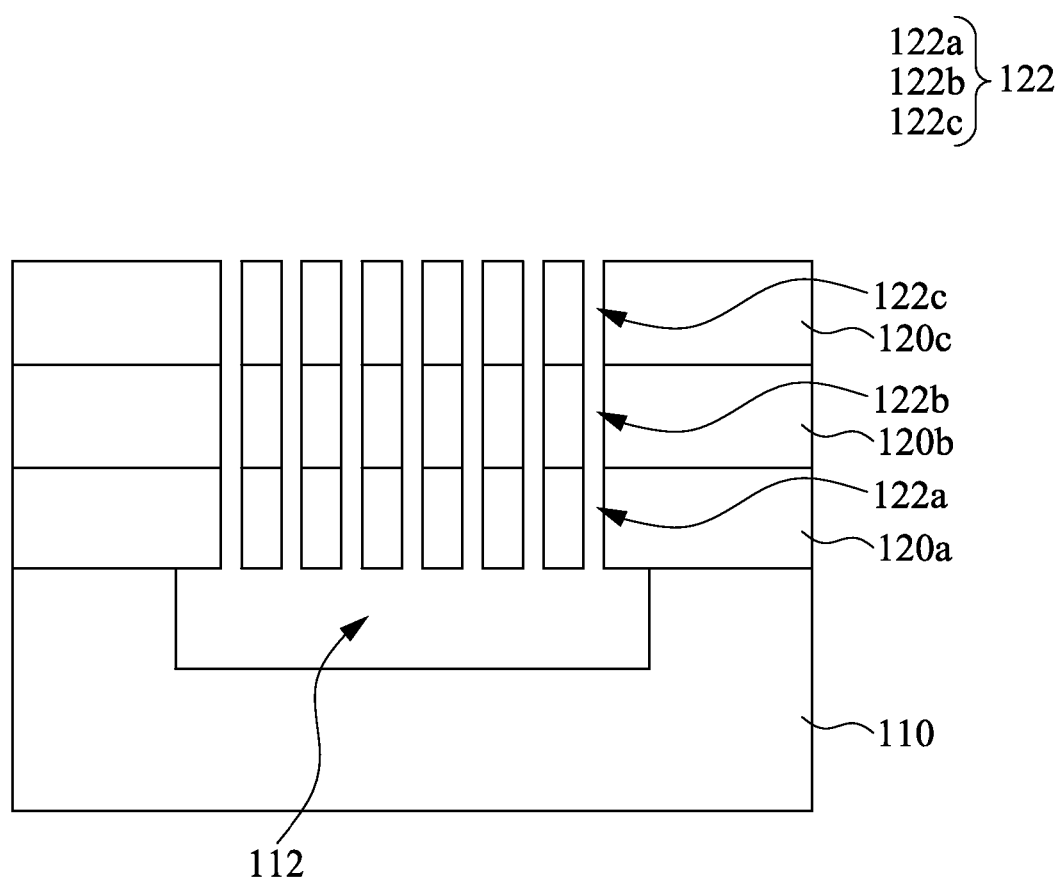

Continuing in FIG. 5G and operation 450, the first support layer 510 and the second support layer 520 are removed. If the optional operations in FIGS. 5E and 5F are performed, the third support layer 430 is also removed along with the first support layer 510 and the second support layer 420, so as to form a through hole 122 exposing the cavity 112 of the cap 110. In some embodiments, the first support layer 510, the second support layer 520 and the third support layer 530 are removed by using a plasma etching process.

In some embodiments, the first support layer 510, the second support layer 520 and the third support layer 530 include carbon-based polymer material. In various embodiments, the first support layer 510, the second support layer 520 and the third support layer 530 are anti-reflective coating (ARC) films.

The method further includes an operation of bonding a device substrate 140 to the third substrate 120c to form the semiconductor structure shown in FIG. 1C. A first bonding pad 150 is formed on the third substrate 120c, and the first bonding pad 150 is bonded to a second bonding pad 142 of the device substrate 140 by using suitable processes, such as eutectic bonding, thermal compression bonding and adhesive bonding. The device substrate 140 further includes one or more integrated circuits 146 and interconnect layers 144 (e.g., metal lines and vias), and the second bonding pad 142 is electrically connected to the integrated circuits 146 by the interconnect layers 144.

The embodiments of the present disclosure discussed above have advantages over existing methods and structures, and the advantages are summarized below. According to some embodiments, an improved substrate structure for a MEMS device is provided, which a through hole of the substrate structure has an aspect ratio greater than 30 to define MEMS structures. The through hole having the larger aspect ratio allows the MEMS structures to have larger thickness, and therefore satisfy the requirement of the MEMS structures in the next generation. In addition, each of the through hole is composed by multiple sub-through holes, and these sub-through holes are substantially aligned without using complicated alignment mechanism. Specifically, a mask for patterning a first sub-through hole is also applied for patterning a second sub-through hole. Therefore, the first sub-through hole and second sub-through are aligned and jointly form the through hole having the aspect ratio greater than 30, and thus increase the efficiency of the fabricating process.

In accordance with some embodiments, the present disclosure discloses a substrate structure for a micro electro mechanical system (MEMS) device. The substrate structure includes a cap and a micro electro mechanical system (MEMS) substrate. The cap has a cavity, and the MEMS substrate is disposed on the cap. The MEMS substrate has a plurality of through holes exposing the cavity, and an aspect ratio of the through hole is greater than 30.

In accordance with various embodiments, the present disclosure discloses a method of fabricating a semiconductor structure, the method includes following steps. A trench is formed in a first substrate, and a second substrate having a second sub-through hole is stacked on the first substrate, which the second sub-through hole exposes the trench. A cap having a cavity is bonded on the second substrate, and a thickness of the first substrate is reduced to convert the trench into a first sub-through hole.

In accordance with various embodiments, the present disclosure discloses a method of fabricating a semiconductor structure, the method includes following steps. A cap having a cavity is received, and a first support layer is filled in the cavity. A first substrate is formed to cover the first support layer, and a first sub-through hole is formed in the first substrate to expose the first support layer. A second support layer is filled in the first sub-through hole, and a second substrate is formed to cover the second support layer. A second sub-through hole is formed in the second substrate to expose the second support layer, and the first support layer and the second support layer are removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, the method comprising:
    forming a trench in a first substrate;
    stacking a second substrate having a second sub-through hole on the first substrate, and the second sub-through hole exposing the trench;
    bonding a cap having a cavity on the second substrate; and
    reducing a thickness of the first substrate to convert the trench into a first sub-through hole.

2. The method of claim 1, wherein stacking the second substrate having the second sub-through hole on the first substrate comprises:
    forming the second substrate on the first substrate;
    reducing a thickness of the second substrate; and
    forming the second sub-through hole in the second substrate to expose the trench.

3. The method of claim 1, further comprising:
    stacking a third substrate having a third sub-through hole on the second substrate, and the third sub-through hole exposing the second sub-through hole.

4. The method of claim 3, wherein stacking the third substrate having the third sub-through hole on the second substrate comprises:
    forming the third substrate on the second substrate;
    reducing a thickness of the third substrate; and
    forming the third sub-through hole in the third substrate to expose the second sub-through hole.

5. The method of claim 1, further comprising bonding a device substrate to the first substrate.

6. The method of claim 1, wherein reducing the thickness of the first substrate comprises:
    polishing the first substrate; and
    etching the first substrate to expose the trench.

7. A method of fabricating a semiconductor structure, the method comprising:
    receiving a cap having a cavity;
    filling a first support layer in the cavity;
    forming a first substrate to cover the first support layer;
    forming a first sub-through hole in the first substrate to expose the first support layer;
    filling a second support layer in the first sub-through hole;
    forming a second substrate to cover the second support layer;
    forming a second sub-through hole in the second substrate to expose the second support layer; and
    removing the first support layer and the second support layer.

8. The method of claim 7, further comprising reducing a thickness of the first substrate before forming the first sub-through hole.

9. The method of claim 7, further comprising reducing a thickness of the second substrate before forming the second sub-through hole.

10. The method of claim 7, further comprising:
    filling a third support layer in the second sub-through hole;
    forming a third substrate to cover the third support layer;
    reducing a thickness of the third substrate;
    forming a third sub-through hole in the third substrate to expose the third support layer; and
    removing the third support layer.

11. The method of claim 10, further comprising bonding a device wafer to the third substrate.

12. The method of claim 10, wherein the first support layer, the second support layer and the third support layer comprises carbon-based polymer material.

13. The method of claim 10, wherein the first support layer, the second support layer and the third support layer are removed by a plasma etching process.

14. The method of claim 1, wherein forming the trench in the first substrate is performed by an etch process.

15. The method of claim 14, wherein the etching process is a deep reactive-ion etching (DRIE) process to make the trench have a depth less than 30 um, and a width of the trench is in a range from about 1 um to about 2 um.

16. The method of claim 1, wherein stacking the second substrate on the first substrate is performed by bonding.

17. The method of claim 1, wherein the second sub-through hole is formed in a depth less than 30 um, and a width in a range from about 1 um to about 2 um.

18. The method of claim 16, wherein the second sub-through hole is formed in the second substrate before bonding the first substrate and the second substrate.

19. The method of claim 10, the thickness of the third substrate is reduced before forming the third sub-through hole.

20. The method of claim 19, wherein the third sub-through hole is formed in a depth less than 30 um, and a width in a range from about 1 um to about 2 um.

* * * * *